(12) United States Patent
Shin et al.

(10) Patent No.: US 9,252,117 B2
(45) Date of Patent: Feb. 2, 2016

(54) SEMICONDUCTOR DEVICE CONNECTED BY ANISOTROPIC CONDUCTIVE FILM

(71) Applicants: Kyoung Hun Shin, Uiwang-si (KR); Kyu Bong Kim, Uiwang-si (KR); Hyun Joo Seo, Uiwang-si (KR); Young Ju Shin, Uiwang-si (KR); Woo Jun Lim, Uiwang-si (KR)

(72) Inventors: Kyoung Hun Shin, Uiwang-si (KR); Kyu Bong Kim, Uiwang-si (KR); Hyun Joo Seo, Uiwang-si (KR); Young Ju Shin, Uiwang-si (KR); Woo Jun Lim, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 14/072,872

(22) Filed: Nov. 6, 2013

(65) Prior Publication Data

US 2014/0159229 A1  Jun. 12, 2014

(30) Foreign Application Priority Data

Dec. 11, 2012  (KR) .................. 10-2012-0143299

(51) Int. Cl.
*H01L 23/52* (2006.01)
*H01L 23/00* (2006.01)

(52) U.S. Cl.
CPC ............... *H01L 24/29* (2013.01); *H01L 24/27* (2013.01); *H01L 24/32* (2013.01); *H01L 24/83* (2013.01); *H01L 2224/2784* (2013.01); *H01L 2224/27502* (2013.01); *H01L 2224/294* (2013.01); *H01L 2224/2929* (2013.01); *H01L 2224/2939* (2013.01); *H01L 2224/2949* (2013.01); *H01L 2224/29082* (2013.01); *H01L 2224/29291* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29366* (2013.01); *H01L 2224/29371* (2013.01); *H01L 2224/29386* (2013.01); *H01L 2224/29393* (2013.01); *H01L 2224/29499* (2013.01); *H01L 2224/32225* (2013.01); *H01L 2224/73204* (2013.01); *H01L 2224/8388* (2013.01); *H01L 2224/83101* (2013.01); *H01L 2224/83855* (2013.01); *H01L 2224/83885* (2013.01);

(Continued)

(58) Field of Classification Search
CPC ......... H01L 24/29; H01L 24/83; H01L 24/27; H01L 2224/8388; H01L 2924/07811; H01L 23/4828; H01L 23/5328; H01L 2224/8085; H01L 2224/2939; H01L 24/32
USPC ................. 257/783, E23.075, E23.166, 746; 438/118, 119
See application file for complete search history.

(56) References Cited

U.S. PATENT DOCUMENTS 6,352,775 B1 * 3/2002 Sasaki et al. ............ B32B 27/06
428/403
2004/0079464 A1 * 4/2004 Kumakura ............ H01L 21/563
156/60

(Continued)

FOREIGN PATENT DOCUMENTS

KR  10-0727741 B1  6/2007
KR  10-2010-0073848 A  7/2010

*Primary Examiner* — Jarrett Stark
*Assistant Examiner* — Shahed Ahmed
(74) *Attorney, Agent, or Firm* — Lee & Morse P.C.

(57) ABSTRACT

A semiconductor device connected by an anisotropic conductive film, the film having a storage modulus of 100 MPa to 300 MPa at 40° C. after curing of the film, and a peak point of 80° C. to 90° C. in a DSC (Differential Scanning calorimeter) profile of the film.

11 Claims, 2 Drawing Sheets

(52) U.S. Cl.
CPC .............. *H01L2924/07811* (2013.01); *H01L 2924/20104* (2013.01); *H01L 2924/20105* (2013.01)

(56) References Cited

U.S. PATENT DOCUMENTS

| | | | |
|---|---|---|---|
| 2006/0154078 A1* | 7/2006 | Watanabe et al. ...... | C09J 7/0203 428/413 |
| 2009/0071703 A1* | 3/2009 | Imahori et al. ........... | H01B 1/22 174/261 |
| 2010/0159234 A1 | 6/2010 | Bae et al. | |
| 2010/0237774 A1* | 9/2010 | Yamazaki et al. ..... | H05B 33/22 313/506 |
| 2011/0110066 A1* | 5/2011 | Yamada et al. ............ | C09J 7/00 361/803 |
| 2011/0290538 A1* | 12/2011 | Han et al. ................ | H05K 3/361 174/254 |

\* cited by examiner

SEMICONDUCTOR DEVICE CONNECTED BY ANISOTROPIC CONDUCTIVE FILM

CROSS-REFERENCE TO RELATED APPLICATION

Korean Patent Application No. 10-2012-0143299, filed on Dec. 11, 2012, in the Korean Intellectual Property Office, and entitled: "Semiconductor Device Connected By Anisotropic Conductive Film," is incorporated by reference herein in its entirety.

BACKGROUND

1. Field

Embodiments relate to a semiconductor device connected by an anisotropic conductive film.

2. Description of the Related Art

An anisotropic conductive film is a material for electrically connecting a small electric component such as a semiconductor device to a substrate or for electrically connecting substrates to each other in manufacture of electronic products such as liquid crystal displays, personal computers, mobile communication devices, and the like.

SUMMARY

Embodiments are directed to a semiconductor device connected by an anisotropic conductive film, the anisotropic conductive film having a storage modulus of 100 MPa to 300 MPa at 40° C. after curing of the film, and a peak point of 80° C. to 90° C. in a DSC (Differential Scanning calorimeter) profile of the film.

The anisotropic conductive film may have a primary compression temperature of 120° C. to 200° C.

The semiconductor device may include a chip-on-flex and a printed circuit board, and the anisotropic conductive film may bond the chip-on-flex to the printed circuit board.

The anisotropic conductive film may include: (A) a thermoplastic resin, (B) a first radical polymerizable material, (C) a second radical polymerizable material, and (D) silica. A ratio (B+C)/(A+D) of a sum (B+C) of a weight of the (B) first radical polymerizable material in terms of solid content and a weight of the (C) second radical polymerizable material in terms of solid content to a sum (A+D) of a weight of the (A) thermoplastic resin in terms of solid content and a weight of the (D) silica in terms of solid content may range from 0.20 to 0.45.

The thermoplastic resin may include one or more of an acrylonitrile butadiene copolymer, an acrylate modified urethane resin, or an acryl copolymer.

The anisotropic conductive film may further include an organic peroxide and conductive particles.

Embodiments are also directed to a semiconductor device connected by an anisotropic conductive film composition, the composition including: (A) a thermoplastic resin, (B) a first radical polymerizable material, (C) a second radical polymerizable material, (D) silica, (E) an organic peroxide, and (F) conductive particles. A ratio (B+C)/(A+D) of a sum (B+C) of a weight of the (B) first radical polymerizable material in terms of solid content and a weight of the (C) second radical polymerizable material in terms of solid content to a sum (A+D) of a weight of the (A) thermoplastic resin in terms of solid content and a weight of the (D) silica in terms of solid content may range from 0.20 to 0.45.

The thermoplastic resin may include one or more of an acrylonitrile butadiene copolymer, an acrylate modified urethane resin, or an acryl copolymer.

The acryl copolymer may be present in an amount of 8 wt % to 20 wt % based on the total weight of the composition in terms of solid content.

The silica may be present in an amount of 3 wt % to 8 wt % based on the total weight of the composition in terms of solid content.

The composition may further include titanium dioxide.

Embodiments are also directed to a semiconductor device, including a first connecting member having a first electrode, a second connecting member having a second electrode, and an anisotropic conductive film placed between the first connecting member and the second connecting member and connecting the first electrode to the second electrode. The anisotropic conductive film may have a storage modulus of 100 MPa to 300 MPa at 40° C. after curing of the film, and a peak point of 80° C. to 90° C. in a DSC (Differential Scanning calorimeter) profile of the film.

Embodiments are also directed to a method for manufacturing a semiconductor device, the method including placing an anisotropic conductive film on a first connecting member having a first electrode, followed by pre-compression, and placing a second connecting member having a second electrode on the anisotropic conductive film, followed by primary compression. The anisotropic conductive film may have a storage modulus of 100 MPa to 300 MPa at 40° C. after curing of the film, and a peak point of 80° C. to 90° C. in a DSC (Differential Scanning calorimeter) profile of the film.

The pre-compression may be performed at 30° C. to 70° C. under a load of 1.0 MPa to 5.0 MPa for 1 to 5 seconds, and the primary compression may be performed at 120° C. to 200° C. under a load of 2.0 MPa to 6.0 MPa for 3 to 7 seconds.

Embodiments are also directed to a semiconductor device manufactured by a method according to an embodiment.

BRIEF DESCRIPTION OF THE DRAWINGS

Features will become apparent to those of skill in the art by describing in detail example embodiments with reference to the attached drawings in which.

DETAILED DESCRIPTION

Figure 1:
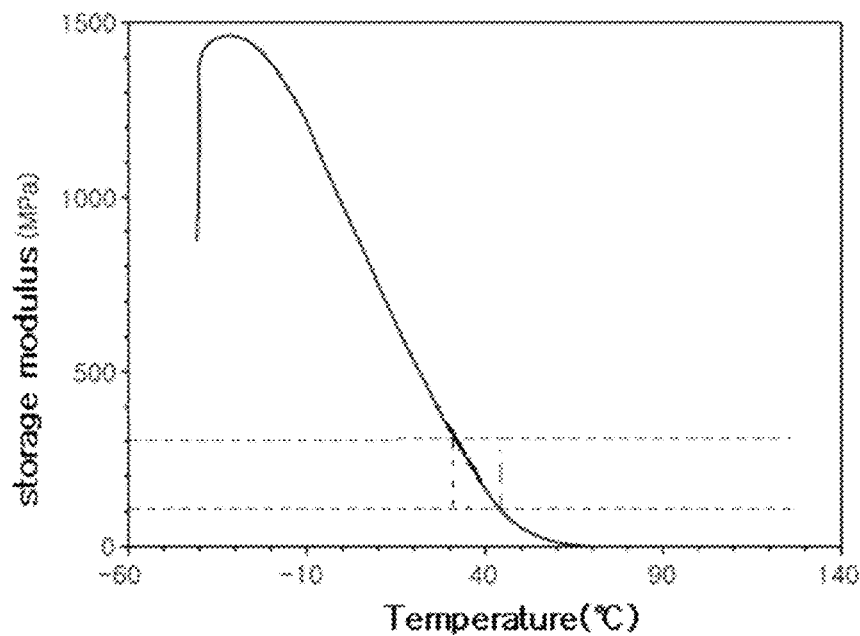
FIG. 1 illustrates a graph depicting variation of storage modulus according to temperature of a film in accordance with an example embodiment.
Figure 2:
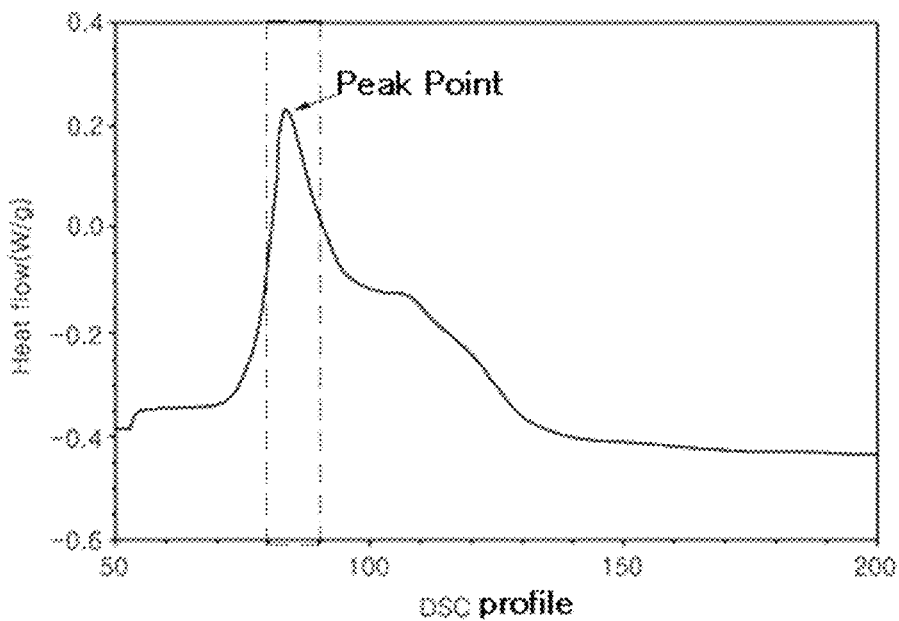
FIG. 2 illustrates a DSC profile of a film in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

An example embodiment provides a semiconductor device connected by an anisotropic conductive film, which has 1) a storage modulus of 100 MPa to 300 MPa at 40° C. after curing of the film, and 2) a peak point of 80° C. to 90° C. in a DSC (Differential Scanning calorimeter) profile of the film.

Storage modulus may be measured at 40° C. after curing the anisotropic conductive film, and curing may be achieved by, for example, placing the anisotropic conductive film on a hot press and heating the film at 190° C. under a load of 30 MPa for 15 minutes. The storage modulus may be measured using a suitable instrument, for example, a DMA (Dynamic Mechanical Analyzer) (TA Instruments).

A general anisotropic conductive film may have a storage modulus of 400 MPa to 2000 MPa at 40° C. after curing. When the storage modulus of the anisotropic conductive film exceeds 300 MPa, the anisotropic conductive film may exhibit strong cohesion after curing, which may cause deterioration in adhesion at an interface between the interconnection substrate and chips. In addition, a binder system may significantly affect increase of the storage modulus. Thus, an anisotropic conductive film having a high storage modulus may not exhibit sufficient flowability in a low temperature process due to high hardness and glass transition temperature of the binder system. If the film has a storage modulus of less than 100 MPa, long-term durability after curing may be affected. When the anisotropic conductive film has a storage modulus of 100 MPa to 300 MPa at 40° C. after curing of the film, it may be possible to secure good initial adhesion and connection reliability between the anisotropic conductive film and the interconnection substrate or chips, and to secure flowability in a low temperature process.

According to the present example embodiment, the storage modulus at 40° C. is obtained by measuring the storage modulus of the film substantially at a temperature of 40° C. with a margin of error of ±2° C., that is, within a temperature range of 40° C.±2° C., e.g., within a temperature range of 40° C.±1° C. Accordingly, for example, an anisotropic conductive film having a storage modulus of 100 MPa to 300 MPa at 38° C. is also within the scope.

In addition, the anisotropic conductive film according to the present example embodiment has a peak point of 80° C. to 90° C. in a DSC (Differential Scanning calorimeter) profile of the film. As used herein, the term "peak point in a DSC profile" refers to a temperature at which the anisotropic conductive film has a maximum heat flux in the DSC profile.

If the film has a peak point of less than 80° C. in the DSC profile, the film may allow bonding at low temperatures, but may have a possibility of suffering bonding failure due to pre-curing according to the process. If the film has a peak point of greater than 90° C. in the DSC profile, the film may not achieve a desirable degree of curing to exhibit characteristics thereof upon low temperature curing.

According to the present example embodiment, the anisotropic conductive film has a primary compression temperature of 120° C. to 200° C., e.g., 130° C. to 190° C. The anisotropic conductive film according to the present example embodiment may permit primary compression within a wide temperature range, which may help achieve rapid curing at low temperatures or at high temperatures. Primary compression may be performed at a temperature of 120° C. to 200° C. under a load of 2.0 MPa to 6.0 MPa for 3~7 seconds, e.g., under a load of 3.0 MPa to 5.0 MPa for 3~6 seconds.

The anisotropic conductive film according to the present example embodiment may be advantageously used to bond a chip-on-flex (COF), integrated circuit (IC) or the like to a printed circuit board (PCB) or a flexible printed circuit board (FPCB), etc.

According to an example embodiment, the anisotropic conductive film may include: (A) a thermoplastic resin, (B) a first radical polymerizable material, (C) a second radical polymerizable material, and (D) silica. According to the present example embodiment, a ratio (B+C)/(A+D) of the sum (B+C) of the (B) first radical polymerizable material and the (C) second radical polymerizable material in terms of solid content to the sum (A+D) of the (A) thermoplastic resin and the (D) silica ranges from 0.20 to 0.45. When the ratio (B+C)/(A+D) ranges from 0.20 to 0.45, the anisotropic conductive film may secure sufficient flowability in a low temperature process and long-term reliability after curing.

The thermoplastic resin may include at least one selected from the group of acrylonitrile butadiene copolymers, acrylate modified urethane resins, and acryl copolymers. The anisotropic conductive film may further include an organic peroxide and conductive particles. The anisotropic conductive film may further include titanium dioxide.

Another example embodiment provides a semiconductor device connected by a composition for an anisotropic conductive film, which includes (A) a thermoplastic resin, (B) a first radical polymerizable material, (C) a second radical polymerizable material, (D) silica, (E) an organic peroxide, and (F) conductive particles. According to the present example embodiment, a ratio (B+C)/(A+D) of the sum (B+C) of the (B) first radical polymerizable material and the (C) second radical polymerizable material in terms of solid content to the sum (A+D) of the (A) thermoplastic resin and the (D) silica ranges from 0.20 to 0.45. When the ratio (B+C)/(A+D) ranges from 0.20 to 0.45, the composition may secure sufficient flowability in a low temperature process and long-term reliability after curing.

The thermoplastic resin may include at least one selected from the group of acrylonitrile butadiene copolymers, acrylate modified urethane resins, and acryl copolymers. The composition may include, e.g., 8% by weight (wt %) to 20 wt % of the acryl copolymer in terms of solid content. The composition may include, e.g., 3 wt % to 8 wt % of the silica in terms of solid content. The composition may further include titanium dioxide.

Another example embodiment provides a semiconductor device, which includes: a first connecting member having a first electrode, a second connecting member having a second electrode, and the anisotropic conductive adhesive film according to an example embodiment placed between the first connecting member and the second connecting member and electrically connecting the first electrode to the second electrode.

Figure 3:
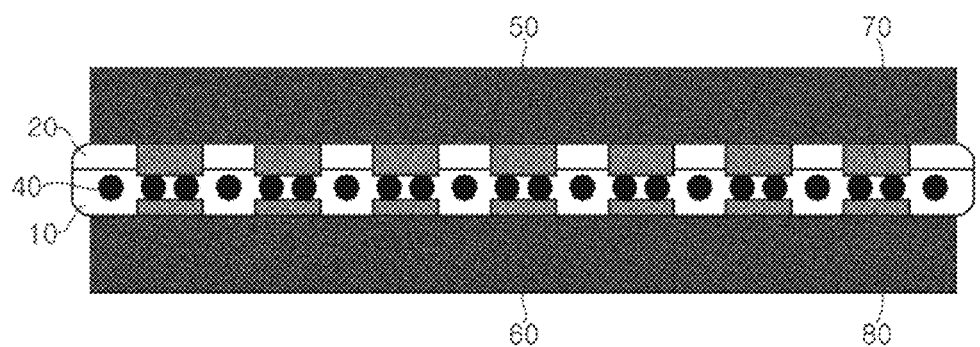
FIG. 3 illustrates a sectional view of a semiconductor device according to an example embodiment.

Referring to FIG. 3, a semiconductor device according to an example embodiment includes a first connecting member 50 having a first electrode 70, a second connecting member 60 having a second electrode 80, and an anisotropic conductive film 10 including conductive particles 40. The first and second connecting members 50, 60 are connected to each other via the anisotropic conductive adhesive film 10 according to an example embodiment. When the anisotropic conductive film 10 placed between the first connecting member 50 having the first electrode 70 and the second connecting member 60 having the second electrode 80 is compressed, the first electrode 70 and the second electrode 80 are connected to each other via the conductive particles 40.

In an example embodiment, the first and second connecting members may have similar structures in terms of material, thickness, size, and interconnectivity. The first and second connecting members may have a thickness of, e.g., about 20 μm to 100 μm. In another embodiment, the first and second connecting members may have different structures and functions in terms of material, thickness, size, and interconnectivity. The first connecting member or the second connecting member may be formed of glass, PCB (Printed Circuit Board), fPCB, COF, TCP, ITO glass, etc. The first electrode or the second electrode may be a protruding electrode or a flat electrode. When the first and second electrodes are protruding electrodes, these electrodes may have a height (H) of about 2.50 μm to about 10 μm, a width (W) of about 50 μm to about 120 μm, and a gap (G) between electrodes of about 50 μm to about 110 μm. For example, the electrodes may have a height (H) of about 2.50 μm to about 9 μm, a width (W) of about 50 μm to about 100 μm, and a gap (G) of about 60 μm to about 90 μm.

When the first and second electrodes are flat electrodes, these electrodes may have a thickness of about 500 Å to about 1200 Å.

The first or second electrode may be formed of ITO, copper, silicon, IZO, etc.

For example, the flat electrodes may have a thickness of 800 Å to 1200 Å, and the protruding electrodes may have a height of 6 μm to 10 μm. In this case, when an insulating layer has a thickness of 4 μm to 12 μm, the adhesive film may provide sufficient adhesion. For example, the flat electrodes may have a thickness of 1000 Å and the protruding electrodes may have a height of 8 μm. In this case, the insulating layer may have a thickness of 6 μm to 10 μm.

Another example embodiment provides a method for manufacturing a semiconductor device, which includes: placing an anisotropic conductive film according to an embodiment on a first connecting member having a first electrode, followed by pre-compression, and placing a second connecting having a second electrode on the pre-compressed anisotropic conductive film, followed by primary compression. According to the present example embodiment, the anisotropic conductive film has 1) a storage modulus of 100 MPa to 300 MPa at 40° C. after curing of the film, and 2) a peak point of 80° C. to 90° C. in a DSC (Differential Scanning calorimeter) profile of the film. The pre-compression may be performed at, e.g., a temperature of 30° C. to 70° C. under a load of 1.0 MPa to 5.0 MPa for 1~5 seconds, and the primary compression may be performed at a temperature of 120° C. to 200° C. under a load of 2.0 MPa to 6.0 MPa for 3~7 seconds.

Next, the respective components of an anisotropic conductive adhesive composition according to an example embodiment will be described.

(A) Thermoplastic Resin

According to the present example embodiment, the thermoplastic resin is a binder system acting as a matrix for forming the anisotropic conductive adhesive film. The thermoplastic resin may include one or more thermoplastic resins. For example, the thermoplastic resin may include at least one selected from among polyurethane, acrylonitrile, acryl, butadiene, polyamide, olefin, and silicone resins. For example, the thermoplastic resin may be selected from among polyurethane, acrylic, and butadiene resins. For example, the thermoplastic resin may include at least one selected from among an acrylate modified urethane resin, an acrylonitrile butadiene copolymer, and an acryl copolymer.

The anisotropic conductive adhesive composition according to the present example embodiment may include an acrylate modified urethane resin as a thermoplastic resin component in terms of flowability and adhesion. The acrylate modified urethane resin may be present in an amount of, e.g., 20 wt % to 60 wt % in the anisotropic conductive adhesive composition in terms of solid content. For example, the acrylate modified urethane resin may be present in an amount of, e.g., 25 wt % to 55 wt % in the anisotropic conductive adhesive composition in terms of solid content.

As a binder system, the acrylate modified urethane resin may have a low glass transition temperature, which may help improve flowability and allow a urethane group in the molecular chain to exhibit high adhesion. For example, when used for the anisotropic conductive film, the acrylate modified urethane resin may reduce the temperature of a connection process by improving curing performance.

Examples of the acrylate modified urethane resin may include diisocyanates, polyols, diols, acrylates, etc.

The diisocyanates may include aromatic, aliphatic, and alicyclic diisocyanates, and combinations thereof. For example, the diisocyanate may include one or more of tetramethylene-1,4-diisocyanate, hexamethylene-1,6-diisocyanate, cyclohexylene-1,4-diisocyanate, methylenebis(4-cyclohexyl isocyanate), isophorone diisocyanate, or 4-4 methylenebis(cyclohexyl diisocyanate).

The polyols may include, e.g., polyester polyol, polyether polyol, polycarbonate polyol, etc., which have two or more hydroxyl groups in the molecular chain. The polyester polyol may be obtained through, e.g., condensation of a dicarboxylic acid compound and a diol compound. Examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, isophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, tetrahydrophthalic acid, etc. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, 1,4-cyclohexanedimethanol, etc. Examples of the polyether polyol may include polyethylene glycol, polypropylene glycol, polytetraethylene glycol, etc. The polyether polyol may have a weight average molecular weight ranging from 400 g/mol to 10,000 g/mol, e.g., a weight average molecular weight from 400 g/mol to 3,000 g/mol. Examples of the polycarbonate polyol may include polyalkylene carbonate and silicone-derived polycarbonate polyol, etc.

Examples of the diol include 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, 1,4-cyclohexanedimethanol, etc.

The acrylate may include, e.g., hydroxy acrylate or amine acrylate.

The acrylate modified urethane resin may be prepared by, e.g., polyaddition polymerization of the aforementioned four components such that a molar ratio (NCO/OH) of the diisocyanate group (NCO) to the hydroxyl group (OH) ranges from 1.04 to 1.6 and the polyol is present in an amount of 70 wt % or less based on the total amount of three components excluding the acrylate, followed by reacting hydroxyl acrylate or amine acrylate with any one of terminal diisocyanates of the prepared urethane in a molar ratio of 0.1 to 2.1. In addition, the remaining isocyanate group may be reacted with alcohols to produce a final acrylate modified urethane resin. According to the present example embodiment, polyaddition polymerization may be performed by a suitable polyaddition polymerization process. For example, the polyaddition polymerization may be performed at a reaction temperature of 90° C. and a reaction pressure of 1 atm for 5 hours using a tin-based catalyst.

According to an example embodiment, the acrylate modified urethane resin may exhibit two glass transition temperatures (Tg), at least one of which may be 0° C. or more. The acrylate modified urethane resin acts as a binder system, which is obtained by phase mixing of a polyol as a soft segment and a diisocyanate as a hard segment and has a single glass transition temperature of 0° C. or more, or two glass transition temperatures, at least one of which is 0° C. or more, to allow film formation at room temperature. In addition, the acrylate modified urethane resin acts as a curing system through a terminal acrylate group by allowing a curing reaction with acryls in the curing system to proceed, which may help provide excellent adhesive strength and high connection reliability.

The acrylate modified urethane resin may have a weight average molecular weight from 1,000 g/mol to 100,000 g/mol, e.g., from 10,000 g/mol to 50,000 g/mol.

In an example embodiment, the acrylic copolymer may be used as the thermoplastic resin.

In an example embodiment, the acrylic copolymer may be prepared by polymerization of acryl monomers, such as ethyl, methyl, propyl, butyl, hexyl, oxyl, dodecyl, or lauryl acrylates, methacrylates, or modified acrylates thereof; acrylic acid, methacrylic acid, methyl methacrylate, vinyl acetate, modified acrylic monomers thereof, etc. As used herein, the term "acryl" refers to both "acryl" and "methacryl". The acrylic copolymer may have a glass transition temperature (Tg) of, e.g., 50° C. to 120° C. Within this range of the glass transition temperature, the composition may provide excellent connection reliability and enable efficient film formation.

According to an example embodiment, the acrylic copolymer contains a hydroxyl group or a carboxyl group to have an acid value of 1 mgKOH/g to 100 mgKOH/g, and may also contain an epoxy group or an alkyl group. Within this range, the adhesive composition may exhibit sufficient adhesion while securing excellent connection reliability.

For example, the acrylic copolymer may have a glass transition temperature of 90° C. and an acid value of 3.4 mgKOH/g, which may help provide strong film characteristics. In an implementation, the acrylic copolymer may function only as a binder. A urethane binder may have a relatively low glass transition temperature. The acrylic copolymer used as the binder according to the present example embodiment may provide more advantages in terms of connection reliability as the glass transition temperature of the acrylic copolymer increases. However, an acrylic copolymer having an excessively high glass transition temperature may be brittle, which may make it difficult to achieve efficient film formation.

According to an example embodiment, the acrylic copolymer may be present in an amount of 8 wt % to 20 wt %, e.g., 10 wt % to 18 wt %, in the composition.

In an example embodiment, the acrylonitrile butadiene copolymer may be used as the thermoplastic resin.

Examples of the acrylonitrile butadiene copolymer may include (meth)acrylate-butadiene copolymer, (meth)acrylate-acrylonitrile-butadiene-styrene copolymer, carboxyl group-modified acrylonitrile-butadiene copolymer, etc. These may be used alone or as mixtures thereof. For example, the thermoplastic resin may be a carboxyl group-modified acrylonitrile-butadiene rubber, which may help improve stability of a resin mixture, adhesion through increase in polarity, humidity resistance, heat resistance, etc.

In an example embodiment, the thermoplastic resin is a carboxyl group-modified acrylonitrile-butadiene rubber having a weight average molecular weight of 2,000 g/mol to 200,000 g/mol, e.g., 3,000 g/mol to 200,000 g/mol. In the present example embodiment, the acrylonitrile-butadiene rubber contains 10 wt % to 60 wt % of acrylonitrile, e.g., 20 wt % to 50 wt %, and 1 wt % to 20 wt % of a carboxyl group.

The acrylonitrile butadiene copolymer may be present in an amount of 1 wt % to 10 wt %, e.g., 2 wt % to 8 wt %, in the composition. Within this range, the composition may not exhibit phase separation and may provide good connection reliability.

In the composition for an anisotropic conductive film according to the present example embodiment, the thermoplastic resin may be present in an amount of 50 wt % to 80 wt %, e.g., 55 wt % to 77 wt %, based on the total weight of the composition for the film in terms of solid content.

(B) First Radical Polymerizable Material

According to the present example embodiment, the first radical polymerizable material is a component of a curing system, and helps secure adhesion between layers bonded to each other and connection reliability through radical curing reaction.

According to the present example embodiment, the first radical polymerizable material contains at least one vinyl group, and may include one or more of acrylate, methacrylate, or maleimide compounds, which may be used in monomer form, oligomer form, or combinations thereof. Examples of the acrylate (methacrylate) may include methyl acrylate, ethyl acrylate, isopropyl acrylate, 4-hydroxybutyl acrylate, isobutyl acrylate, ethylene glycol diacrylate, diethylene glycol diacrylate, trimethylol propane triacrylate, tetramethylol methane tetraacrylate, 2-hydroxy-1,3-diacryloxypropane, 2,2-bis[4-(acryloxypolymethoxy)phenyl]propane, 2,2-bis[4-(acryloxypolyethoxy)phenyl]propane, dicyclopentenyl acrylate, tricyclodecanyl acrylate, tris(acryloyloxyethyl)isocyanurate, etc. These may be used alone or in combination thereof.

In the composition, the first radical polymerizable material may be present in an amount of about 2 wt % to about 15 wt %, e.g., about 4 wt % to about 12 wt %, based on the total weight of the composition for the film in terms of solid content.

(C) Second Radical Polymerizable Material

According to the present example embodiment, the second radical polymerizable material is also a component of the curing system, and may help secure adhesion between layers bonded to each other and connection reliability through radical curing reaction together with the second radical polymerizable material.

According to the present example embodiment, the second radical polymerizable material contains at least one vinyl group in the molecule, and may include one or more of acrylate, methacrylate, or maleimide compounds, which may be used in monomer form, oligomer form, or combinations thereof. The second radical polymerizable material is different from the first radical polymerizable material. Examples of the second radical polymerizable material may include 1,6-hexanediol mono(meth)acrylate, 2-hydroxy ethyl (meth)acrylate, 2-hydroxy propyl(meth)acrylate, 2-hydroxy butyl (meth)acrylate, 2-hydroxy-3-phenyl oxypropyl(meth)acrylate, 1,4-butanediol(meth)acrylate, 2-hydroxyalkyl (meth)acryloyl phosphate, 4-hydroxy cyclohexyl(meth)acrylate, neopentyl glycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth)acrylate, dipentaerythritol hexa(meth)acrylate, glycerine di(meth)acrylate, t-hyrdofurfuryl (meth)acrylate, isodecyl(meth)acrylate, 2-(2-ethoxyethoxy) ethyl (meth)acrylate, stearyl (meth)acrylate, lauryl(meth)acrylate, 2-phenoxyethyl (meth)acrylate, isobornyl (meth)acrylate, tridecyl (meth)acrylate, ethoxylated nonyl phenol(meth)acrylate, ethylene glycol di(meth)acrylate, diethylene glycol di(meth)acrylate, triethylene glycol di(meth)acrylate, tetraethylene glycol di(meth)acrylate, polyethylene glycol di(meth)acrylate, 1,3-butylene glycol di(meth)acrylate, tripropylene glycol di(meth)acrylate, ethoxylated bisphenol-A di(meth)acrylate, cyclohexanedimethanol di(meth)acrylate, phenoxy-t-glycol(meth)acrylate, 2-methacryloyloxyethyl phosphate, dimethylol tricyclodecane di(meth)acrylate, trimethylolpropane benzoate acrylate, fluorene (meth)acrylate, acid phosphoxyethyl (meth)acrylate, etc.

In the composition, the second radical polymerizable material may be present in an amount of about 2 wt % to about 15 wt %, e.g., about 4 wt % to about 12 wt %, based on the total weight of the composition for the film in terms of solid content. Within this content range of the second radical polymerizable material, the composition may exhibit excellent properties in terms of reliability and overall flowability, and may enhance connection reliability after primary compression.

(D) Silica

According to the present example embodiment, the silica may be present in an amount of 3 wt % to 8 wt % based on the total weight of the composition for the film in terms of solid content. Within this content range of silica, the composition may permit efficient adjustment of resin exclusion rate and improve reliability by increasing storage modulus to a predetermined level or more. In addition, the anisotropic conductive adhesive film may have good initial indentation properties and thus may enable electric characteristics. Further, when the silica has a particle diameter ranging from 1 nm to 30 nm, the silica may provide thixotropic characteristics to the film and may control flowability upon pre-compression and primary compression. For example, the composition may contain fumed silica.

(E) Organic Peroxide

According to the present example embodiment, the organic peroxide functions as a curing agent that generates free radicals when heated or exposed to light.

According to the present example embodiment, the organic peroxide may include one or more of ketone peroxide, peroxy ketal, hydroperoxide, dialkyl peroxide, diacyl peroxide, peroxy ester, peroxy carbonate, etc., in view of high connection temperature, time, and the stability for conservation.

Examples of such organic peroxides may include t-butyl peroxylaurate, 1,1,3,3-t-methylbutylperoxy-2-ethyl hexanoate, 2,5-dimethyl-2,5-di(2-ethylhexanoyl peroxy)hexane, 1-cyclohexyl-1-methylethyl peroxy-2-ethyl hexanoate, 2,5-dimethyl-2,5-di(m-toluoyl peroxy)hexane, t-butyl peroxy isopropyl monocarbonate, t-butyl peroxy-2-ethylhexyl monocarbonate, t-hexyl peroxybenzoate, t-butyl peroxyacetate, dicumyl peroxide, 2,5-dimethyl -2,5-di(t-butyl peroxy) hexane, t-butylcumyl peroxide, t-hexyl peroxy neodecanoate, t-hexyl peroxy-2-ethyl hexanoate, t-butyl peroxy-2-2-ethyl-hexanoate, t-butyl peroxy isobutyrate, 1,1-bis(t-butylperoxy) cyclohexane, t-hexyl peroxyisopropyl monocarbonate, t-butyl peroxy-3,5,5-trimethyl hexanoate, t-butyl peroxypivalate, cumyl peroxyneodecanoate, diisopropyl benzenehydroperoxide, cumene hydroperoxide, isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxide, 3,5,5-trimethyl hexanoyl peroxide, benzoyl peroxytoluene, 1,1,3,3-tetramethyl butyl peroxyneodecanoate, 1-cyclohexyl-1-methylethyl peroxy-neodecanoate, di-n-propyl peroxy dicarbonate, di-isopropyl peroxy carbonate, bis(4-t-butyl cyclohexyl) peroxy dicarbonate, di-2-ethoxy methoxy peroxy dicarbonate, di(2-ethyl hexyl peroxy) dicarbonate, dimethoxy butyl peroxy dicarbonate, di(3-methyl-3-methoxy butyl peroxy) dicarbonate, 1,1-bis(t-hexyl peroxy) -3,3,5-trimethyl cyclohexane, 1,1-bis (t-hexyl peroxy) cyclohexane, 1,1-bis(t -butyl peroxy) -3,3, 5-trimethyl cyclohexane, 1,1-(t-butyl peroxy) cyclododecane, 2,2-bis(t -butylperoxy)decane, t-butyltrimethylsilyl peroxide, bis(t-butyl)dimethylsilyl peroxide, t-butyltriallylsilyl peroxide, bis(t-butyl)diallylsilyl peroxide, tris(t-butyl) arylsilyl peroxide, etc.

The organic peroxide may have a half-life of, e.g., 5 to 15 hours at 40° C. to 100° C. Within this range of the half-life of the organic peroxide, the composition may be stable during room-temperature storage and may be suitable for rapid curing.

According to the present example embodiment, the organic peroxide may be present in an amount of 1 wt % to 8 wt %, e.g., 1.5 wt % to 5 wt %. Within this content range of the organic peroxide, the composition may exhibit excellent compression characteristics and re-workability, and may not exhibit bubble generation.

(F) Conductive Particles

According to the present example embodiment, the anisotropic conductive adhesive composition includes the conductive particles in order to improve conductivity upon circuit connection.

According to the present example embodiment, the conductive particles may include at least one type selected from among metal particles including one or more of Au, Ag, Ni, Cu, Pd, Al, Cr, Sn, Ti, or Pb; carbon particles; particles of resins including one or more of benzoguanamine, polyethylene, polyester, polystyrene, or polyvinyl alcohol, or modified resins thereof plated and coated with the metal particles; or insulated conductive particles obtained by further coating insulating particles on the metal-coated polymer resin particles.

The size of the conductive particles may be determined depending on the pitch of circuits to be applied and may range from, e.g., 0.1 μm to 30 μm according to intended application. For example, the conductive particles may have a particle size of 0.5 μm to 15 μm.

The conductive particles may be present in an amount of, e.g., 1 wt % to 10% by weight. Within this range, the conductive particles may retain inherent conductivity while maintaining insulating properties. The conductive particles may be present in an amount of, e.g., 2 wt % to 8 wt % or 3 wt % to 6 wt %.

The anisotropic conductive adhesive composition according to the present example embodiment may include additives such as polymerization inhibitors, anti-oxidants, heat stabilizers, etc., which may provide additional properties. The additives may be present in an amount of, e.g., 0.01 wt % to 10 wt % in the composition in terms of solid content.

The polymerization inhibitor may include one or more of hydroquinone, hydroquinone monomethylether, p-benzoquinone, or phenothiazine. The anti-oxidant may include phenolic or hydroxy cinnamate materials. For example, the anti-oxidant may include tetrakis-(methylene-(3,5-di-t-butyl-4-hydroxycinnamate)methane, 3,5-bis(1,1-dimethylethyl)-4-hydroxy-benzenepropanoic acid thiol di-2,1-ethanediyl ester, etc.

An example embodiment provides an anisotropic conductive adhesive film prepared using the anisotropic conductive adhesive composition according to an embodiment. A general apparatus or equipment may be used to form the anisotropic conductive film. For example, the anisotropic conductive film may be obtained by dissolving the anisotropic conductive adhesive composition in an organic solvent such as toluene, stirring the mixture for a certain period of time at a rate that does not cause pulverization of the conductive particles, applying the mixture to an appropriate thickness (for example, 10 μm to 50 μm) onto a release film, and drying the mixture for a sufficient time to vaporize the toluene.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Examples 1 to 3

Preparation of Anisotropic Conductive Composition and Film

An acrylonitrile butadiene copolymer, acrylate modified urethane resins 1 and 2, an acryl copolymer, first and second radical polymerizable materials (radical polymerizable materials 1 and 2, respectively), an organic peroxide, titanium dioxide, silica, and conductive particles were blended in amounts as listed in Table 1, followed by stirring at 25° C. for 60 minutes using a planetary mixer while preventing the conductive particles from being pulverized. The resulting mixture was coated on a polyethylene base film subjected to silicone release surface treatment to form a 35 μm thick film. A casting knife was used to form the film, which in turn was dried at 60° C. for 5 minutes, thereby preparing each of anisotropic conductive films of Examples 1 to 3.

Comparative Example 1-4

Preparation of Anisotropic Conductive Composition and Film

Anisotropic conductive films were prepared in the same manner as in the Examples except for the amounts of components as shown in Table 1.

In these Examples and Comparative Examples, the respective components were added in amounts as shown in Table 1.

TABLE 1

|  | E 1 | E 2 | E 3 | CE 1 | CE 2 | CE 3 | CE 4 |
|---|---|---|---|---|---|---|---|
| 1) Acrylonitrile butadiene copolymer | 5 | 5 | 5 | 5 | 10 | 20 | 5 |
| 2) Acrylate modified urethane resins 1 | 30 | 25 | 25 | 40 | 20 | 30 | 30 |
| 3) Acrylate modified urethane resins 2 | 18 | 28 | 25 | 11 | 13 | 16 | 30 |
| 4) Acryl copolymer | 10 | 15 | 15 | 5 | 30 | 10 | 10 |
| 5) Radical polymerizable material 1 | 10 | 7 | 7 | 15 | 3 | 5 | 3 |
| 6) Radical polymerizable material 2 | 15 | 10 | 10 | 15 | 7 | 10 | 10 |
| 7) Organic peroxide | 5 | 3 | 4 | 5 | 3 | 3 | 5 |
| 8) Titanium dioxide | 1 | 1 | 1 | 1 | 1 | 1 | 1 |
| 9) Silica | 3 | 3 | 5 |  | 10 | 2 | 3 |
| 10) Conductive particles | 3 | 3 | 3 | 3 | 3 | 3 | 3 |
| Total | 100 | 100 | 100 | 100 | 100 | 100 | 100 |
| Storage modulus at 40° C. (MPa) | 100 | 200 | 300 | 50 | 500 | 200 | 200 |
| Peak point in DSC profile (° C.) | 83 | 88 | 85 | 82 | 85 | 93 | 75 |
| (B + C)/(A + D) | 0.38 | 0.22 | 0.23 | 0.49 | 0.12 | 0.19 | 0.17 |

A = 1) + 2) + 3) + 4), D = 9), B = 5), C = 6)

1) Acrylonitrile butadiene copolymer: Acrylonitrile butadiene copolymer (1072CGX, Zeon Chemical Co., Ltd.) dissolved in toluene/methylethylketone to 25 vol % (% by volume)
2) Acrylate modified urethane resins 1: Polyurethane acrylate (weight average molecular weight: 25,000 g/mol) prepared by polyaddition polymerization using dibutyltindilaurylate as a catalyst under conditions of 60 wt % of a polyol and a mole ratio of hydroxyl methacrylate/isocyanate of 0.5 dissolved in methylethylketone to 50 vol % at 90° C. and 1 atm for 5 hours
3) Acrylate modified urethane resins 2: Polyurethane acrylate (weight average molecular weight: 28,000 g/mol) prepared by polyaddition polymerization using dibutyltindilaurylate as a catalyst under conditions of 60 wt % of a polyol and a mole ratio of hydroxyl acrylate to isocyanate of 1 dissolved in methylethylketone to 50 vol % at 90° C. and 1 atm for 5 hours
4) Acryl copolymer: Acryl resin (AOF7003, Aekyung Chemical Co., Ltd.) dissolved in toluene/methylethylketone to 45 vol % and having a weight average molecular weight of 90,000~120,000
5) Radical polymerizable material 1: 4-hydroxybutyl acrylate
6) Radical polymerizable material 2: tetrahydrofurfuryl acrylate
7) Organic peroxide: lauroyl peroxide
8) Titanium dioxide: $TiO_2$
9) Conductive particles: Conductive particles having a particle size of 5 μm
10) Silica: Fumed silica Experimental Example Measurement of storage Modulus at 40° C., Initial Adhesive Strength, Initial Connection Resistance, and Connection Resistance After Reliability Testing Storage modulus at 40° C., initial adhesive strength, initial connection resistance, and connection resistance after reliability testing of the anisotropic conductive films prepared in Examples and Comparative Examples were measured as follows.

(1) Storage Modulus at 40° C.

With a 35 μm thick anisotropic conductive film placed on a hot press, 0.2 mm thick silicone rubber was placed on the film and subjected to heating and compression at 190° C. and 30 MPa for 15 minutes to cure the connection material, followed by removing a release film.

Then, the storage modulus at 40° C. of the film was measured using a dynamic mechanical analyzer (DMA) (TA Instruments) while increasing the temperature from −40° C. to 200° C. at a rate of 10° C./min.

(2) Initial Adhesive Strength and Initial Connection Resistance

To measure adhesive strength and connection resistance of the anisotropic conductive films prepared in Examples and Comparative Examples, each of the films was placed between PCB (pitch: 200 μm, terminal width: 100 μm, distance between terminals: 100 μm, terminal height: 35 μm) and a COF film pitch: 200 μm, terminal width: 100 μm, distance between terminals: 100 μm, terminal height: 8 μm), and connected under the following conditions.

1) Pre-compression; 50° C., 1 second, 1.0 MPa
2) Primary compression; 130° C., 3 seconds, 3.0 MPa (Condition 1), 190° C., 3 second, 4.0 MPa (Condition 2)

The adhesive strength of the compressed film with respect to the PCB or COF film was measured using a universal testing machine (UTM) (Hounsfield Model No. H5KT) by the following method: 1) After mounting a Load Cell to the testing machine, 2) grips were provided to the testing machine, and 3) a sample was gripped by the grips to measure adhesive strength in a 90° peeling manner at a tensile test speed of 50 mm/min.

Connection resistance was measured by a 4-probe method using a resistance tester 2000 Multimeter (Keithley Co., Ltd.) by applying a test current of 1 mA.

(3) Connection Resistance after Reliability Testing

To evaluate reliability of the films, film specimens were left in a chamber at 85° C. and 85% RH for 500 hours, followed by measuring the connection resistance by the same method as above, and an average value was calculated.

Measurement results are shown in Table 2.

(MLCC), a through-hole, or the like may decrease, which may cause significant temperature deviation. The temperature deviation may also be caused by heat dissipation for each pattern of a printed circuit board (PCB).

A general anisotropic conductive film may exhibit improved high temperature characteristics to secure processability by taking temperature deviation into account. In this case, however, there is a high possibility of suffering bonding failure or misalignment due to shrinkage/expansion of a PCB, and there may be issues relating to equipment management due to the use of bonding equipment at high temperature. For example, a rapid-curable anisotropic conductive adhesive may be considered for minimizing a rate of decrease in adhesive strength over time and rate of increase in connection resistance over time while improving flowability and reliability. However, such an anisotropic conductive adhesive may be used as an adhesive for bonding at a high temperature of 180° C. or more, and may suffer bonding failure or problems relating to equipment management. In addition, even in the case that the available temperature of the bonding equipment is increased as high as possible, the bonding equipment may sometimes fail to obtain a desired bonding temperature according to the kind of PCB.

An anisotropic conductive film that enables bonding at low temperature (for example, at a bonding temperature of about 130° C.) may help avoid bonding failure and misalignment due to bonding at high temperature.

As described above, embodiments may provide a semiconductor device connected by an anisotropic conductive film that may enable bonding at low temperature, which may avoid bonding failure, misalignment, and problems relating to equipment management due to bonding at high temperature.

In a semiconductor device according to an example embodiment, an anisotropic conductive film may exhibit excellent adhesion and connection reliability under bonding conditions in a wide range of bonding temperatures from 120° C. to 200° C. when placed between a first connecting member and a second connecting member and subjected to primary compression. In addition, a semiconductor device according to an example embodiment may have a low reduction rate of adhesive strength and a low increase rate of connection resistance even after reliability testing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be

TABLE 2

|  |  | E 1 | E 2 | E 3 | CE 1 | CE 2 | CE 3 | CE 4 |
|---|---|---|---|---|---|---|---|---|
| Initial adhesive strength (gf/cm) | 130° C. | 1170 | 1170 | 1216 | 1206 | 796 | 887 | 1070 |
|  | 190° C. | 1554 | 1421 | 1630 | 1521 | 754 | 1354 | 804 |
| Initial resistance (Ω) | 130° C. | 0.028 | 0.028 | 0.028 | 0.025 | 0.021 | 0.028 | 0.029 |
|  | 190° C. | 0.028 | 0.028 | 0.025 | 0.032 | 0.024 | 0.028 | 0.078 |
| Connection resistance after reliability testing (Ω) | 130° C. | 0.034 | 0.033 | 0.033 | 0.306 | 0.036 | 0.302 | 0.035 |
|  | 190° C. | 0.034 | 0.036 | 0.034 | 0.120 | 0.040 | 0.035 | 5.176 |

By way of summation and review, with a recent trend toward large panels and fine interconnection lines, a connecting substrate may become thin, and distances between a circuit connecting portion and a chip, a multi-layer ceramic chip used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A semiconductor device connected by an anisotropic conductive film, the anisotropic conductive film:
   having a storage modulus of 100 MPa to 300 MPa at 40° C. after curing of the film by heating and compression at 190° C. and 30 MPa for 15 minutes,
   having a peak point of 80° C. to 90° C. in a DSC (Differential Scanning calorimeter) profile of the film, and
   including (A) a thermoplastic resin; (B) a first radical polymerizable material; (C) a second radical polymerizable material; (D) silica; and (E) an organic peroxide, wherein a ratio (B+C)/(A+D) of sum (B+C) of weight of the (B) first radical polymerizable material in terms of solid content and a weight of the (C) second radical polymerizable material in terms of solid content to a sum (A+D) of a weight of the (A) thermoplastic resin in terms of solid content and a weight of the (D) silica in terms of solid content ranges from 0.20 to 0.45.

2. The semiconductor device as claimed in claim 1, wherein the anisotropic conductive film has a primary compression temperature of 120° C. to 200° C.

3. The semiconductor device as claimed in claim 1, wherein the semiconductor device includes a chip-on-flex and a printed circuit board, and the anisotropic conductive film bonds the chip-on-flex to the printed circuit board.

4. The semiconductor device as claimed in claim 1, wherein the thermoplastic resin includes one or more of an acrylonitrile butadiene copolymer, an acrylate modified urethane resin, or an acryl copolymer.

5. The semiconductor device as claimed in claim 1, wherein the anisotropic conductive film further includes conductive particles.

6. A semiconductor device connected by an anisotropic conductive film composition, the composition comprising: (A) a thermoplastic resin; (B) a first radical polymerizable material; (C) a second radical polymerizable material; (D) silica; (E) an organic peroxide; and (F) conductive particles, wherein a ratio (B+C)/(A+D) of a sum (B+C) of a weight of the (B) first radical polymerizable material in terms of solid content and a weight of the (C) second radical polymerizable material in terms of solid content to a sum (A+D) of a weight of the (A) thermoplastic resin in terms of solid content and a weight of the (D) silica in terms of solid content ranges from 0.20 to 0.45.

7. The semiconductor device as claimed in claim 6, wherein the thermoplastic resin includes one or more of an acrylonitrile butadiene copolymer, an acrylate modified urethane resin, or an acryl copolymer.

8. The semiconductor device as claimed in claim 7, wherein the acryl copolymer is present in an amount of 8 wt % to 20 wt % based on the total weight of the composition in terms of solid content.

9. The semiconductor device as claimed in claim 6, wherein the silica is present in an amount of 3 wt % to 8 wt % based on the total weight of the composition in terms of solid content.

10. The semiconductor device as claimed in claim 6, wherein the composition further comprises titanium dioxide.

11. A semiconductor device, comprising:
    a first connecting member having a first electrode;
    a second connecting member having a second electrode; and
    an anisotropic conductive film placed between the first connecting member and the second connecting member and connecting the first electrode to the second electrode, wherein the anisotropic conductive film:
    has a storage modulus of 100 MPa to 300 MPa at 40° C. after curing of the film by heating and compression at 190° C. and 30 MPa for 15 minutes,
    has a peak point of 80° C. to 90° C. in a DSC (Differential Scanning calorimeter) profile of the film, and
    includes (A) a thermoplastic resin; (B) a first radical polumerizable material; (C) a second radical polymerizable material; (D) silica; and (E) an organic peroxide, wherein a ration (B+C)/(A+D) of a sum (B+C) of a weight of the (B) first radical polymerizable material in terms of solid content and a weight of the (C) second radical polymerizable material in terms of solid content to a sum (A+D) of a weight of the (A) thermoplastic resin in terms of solid content and a weight of the (D) silica in terms of solid content ranges form 0.20 to 0.45.

* * * * *